United States Patent
Fiedler

(10) Patent No.: US 6,701,466 B1
(45) Date of Patent: Mar. 2, 2004

(54) SERIAL DATA COMMUNICATION RECEIVER HAVING ADAPTIVELY MINIMIZED CAPTURE LATCH OFFSET VOLTAGE

(75) Inventor: Alan S. Fiedler, Bloomington, MN (US)

(73) Assignee: LSI Logic Corporation, Milpitas, CA (US)

( * ) Notice: Subject to any disclaimer, the term of this patent is extended or adjusted under 35 U.S.C. 154(b) by 456 days.

(21) Appl. No.: 09/677,350

(22) Filed: Oct. 2, 2000

(51) Int. Cl.[7] ............................................ G06K 5/04
(52) U.S. Cl. ..................................... 714/699; 714/704
(58) Field of Search ............................ 714/774, 704, 714/700, 699, 746, 707, 731, 775, 789, 798; 327/42; 375/355, 225; 341/100; 326/101; 370/300

(56) References Cited

U.S. PATENT DOCUMENTS

| | | | | |
|---|---|---|---|---|
| 4,476,431 A | * | 10/1984 | Blum ......................... | 714/731 |
| 4,493,077 A | * | 1/1985 | Agrawal et al. ............ | 714/731 |
| 4,594,563 A | * | 6/1986 | Williams .................... | 331/1 A |
| 4,682,329 A | * | 7/1987 | Kluth et al. ................ | 714/731 |
| 4,825,097 A | * | 4/1989 | Bazil et al. ................. | 327/204 |
| 5,444,715 A | * | 8/1995 | Gruetzner et al. ......... | 714/727 |
| 5,633,899 A | | 5/1997 | Fielder et al. .............. | 375/376 |
| 5,761,216 A | * | 6/1998 | Sotome et al. ............. | 714/738 |
| 5,793,227 A | * | 8/1998 | Goldrian ..................... | 326/94 |
| 6,463,109 B1 | * | 10/2002 | McCormack et al. ....... | 375/355 |

OTHER PUBLICATIONS

"Rate–Independent" CDR Chip Locks In At Up To 2.7 Gbits/s, *Electronic Design*, (Mar. 20, 2000) http://www.el-ecdesign.com/magazine/2000/mar2000/coverstory/cov1.shtml?ads=communication.

* cited by examiner

*Primary Examiner*—Albert Decady
*Assistant Examiner*—Mujtaba Chaudry
(74) *Attorney, Agent, or Firm*—Westman, Champlin & Kelly

(57) ABSTRACT

A serial data communication receiver includes a serial data input and first and second sets of data capture latches, which are coupled to the serial data input and have first and second recovered data outputs, respectively. One of the sets is designated as a master set and the other a slave set. Each data capture latch has a respective independently adjustable offset voltage. An offset adjustment control circuit varies the respective offset voltage over a range of offset voltage values for each of the data capture latches in the slave set while comparing the first and second recovered data outputs to produce an error output. The control circuit then sets each of the respective offset voltages in the slave set to one of the offset voltage values based on the error output.

14 Claims, 4 Drawing Sheets

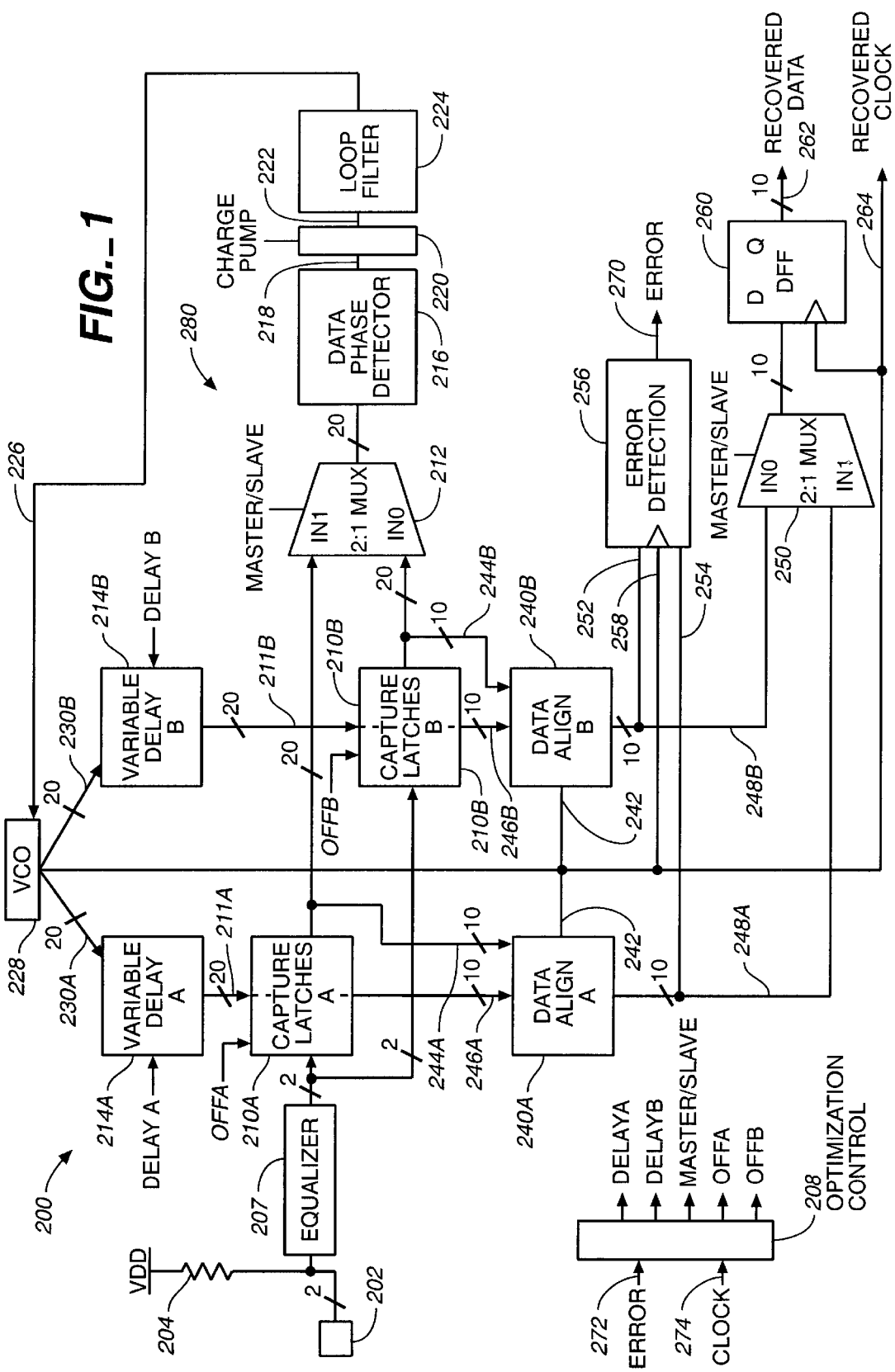
FIG._1

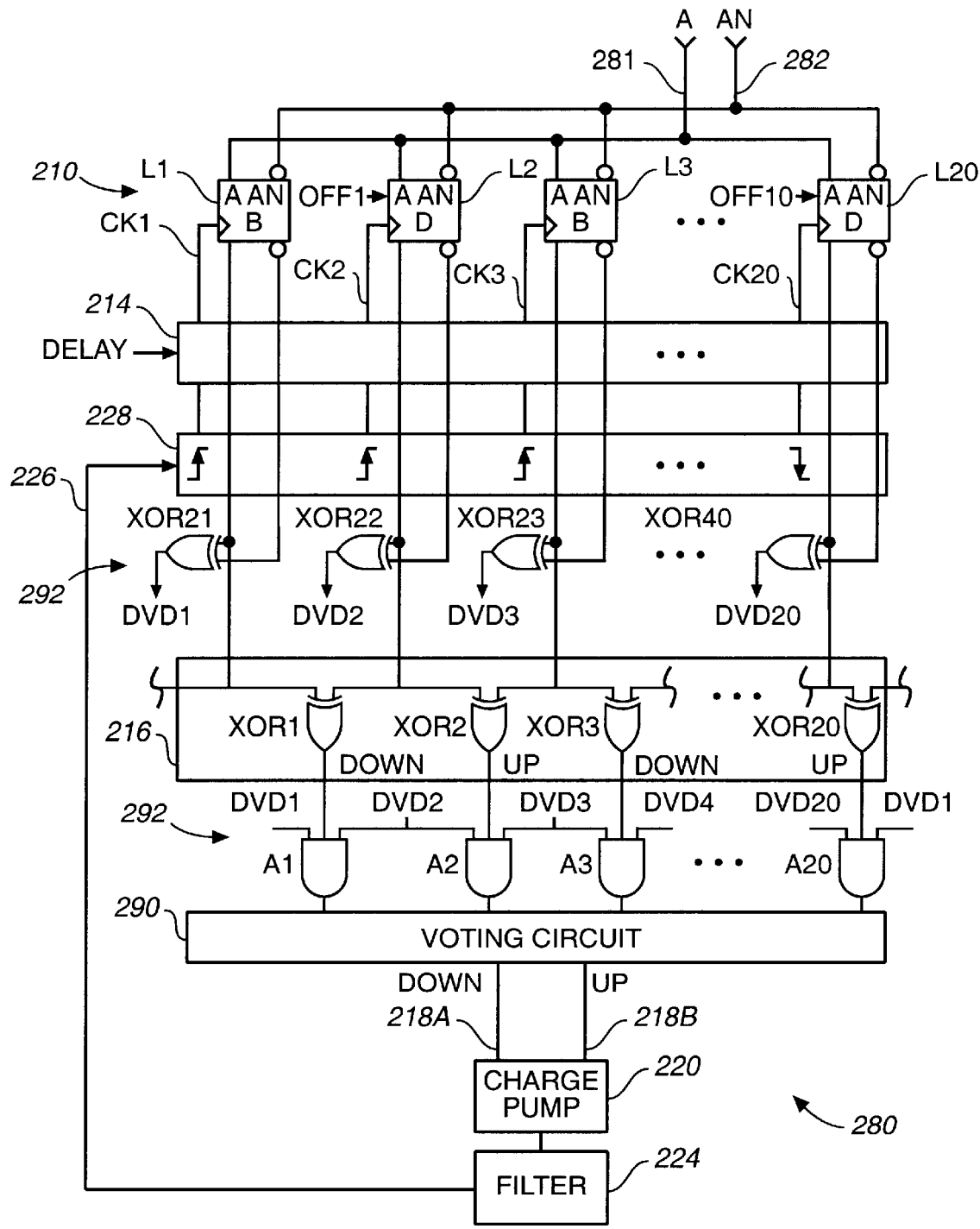
FIG._2

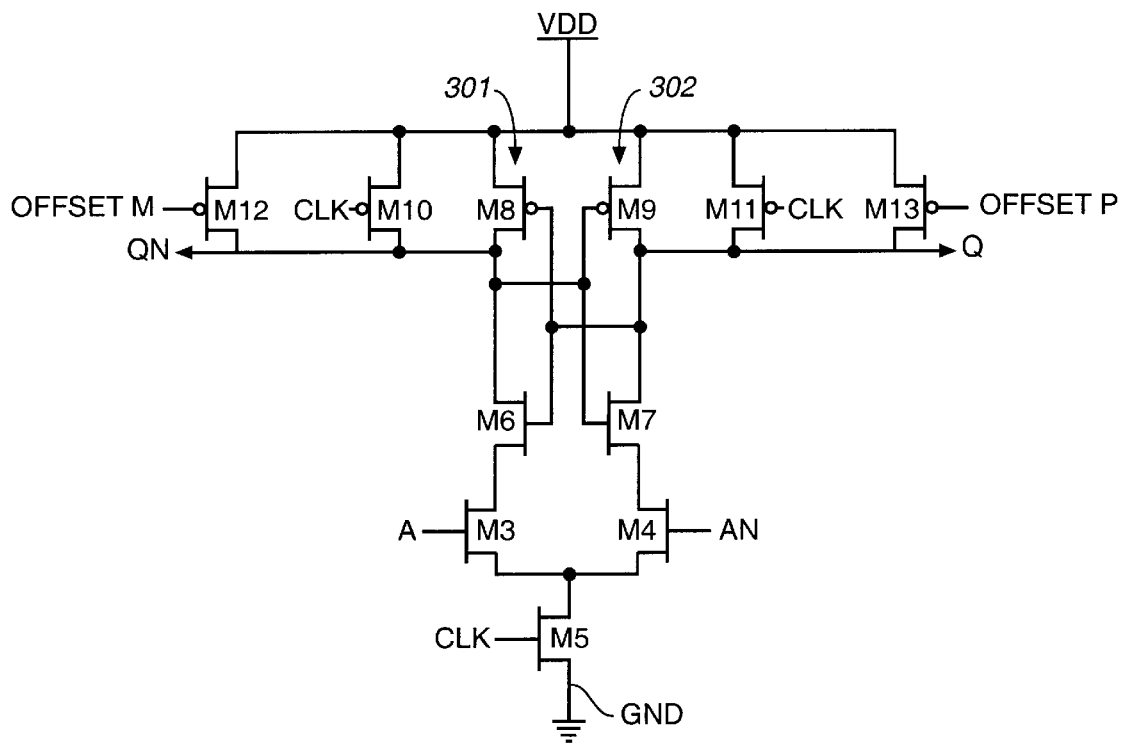
FIG._3

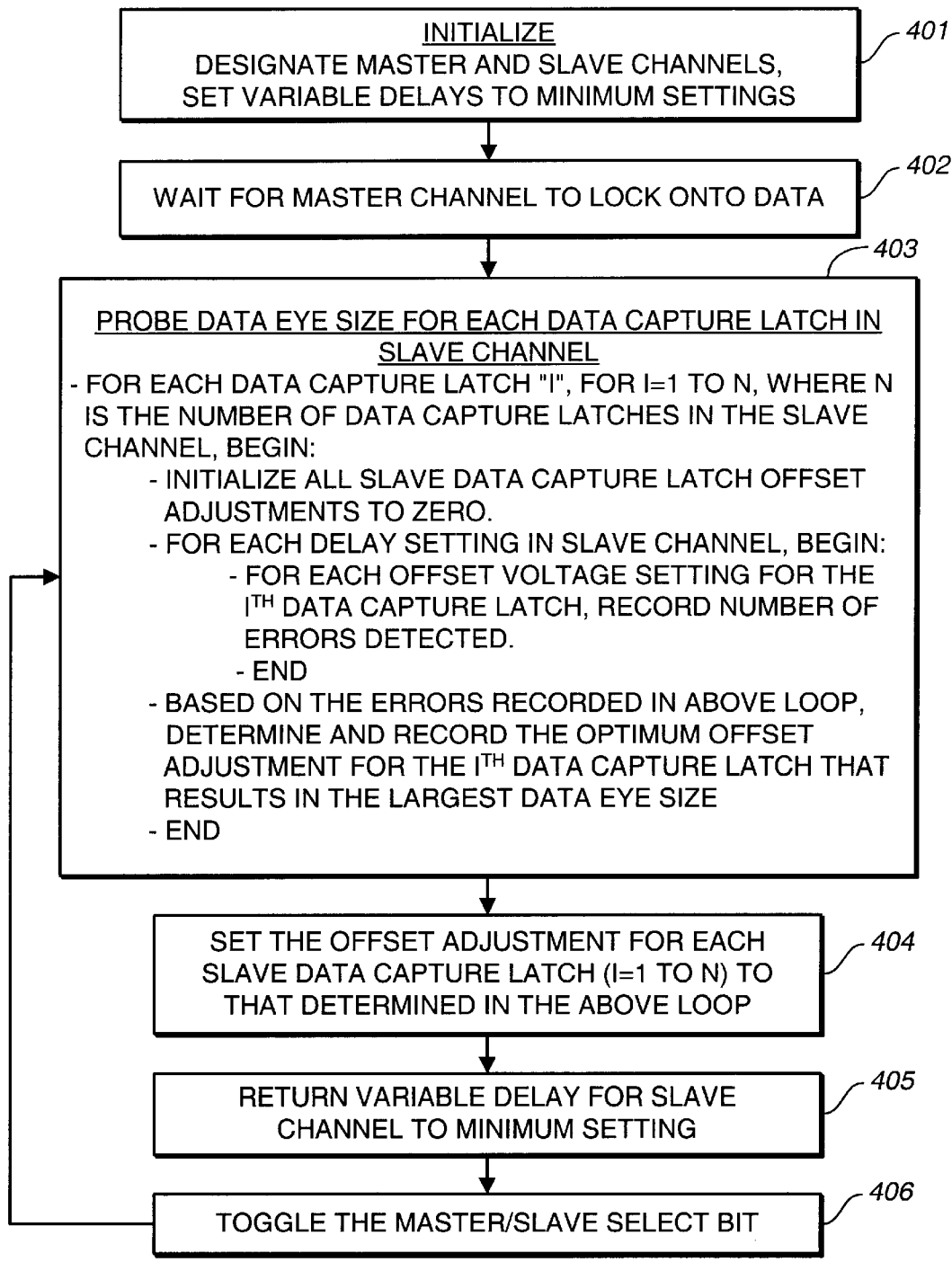
FIG._4

SERIAL DATA COMMUNICATION RECEIVER HAVING ADAPTIVELY MINIMIZED CAPTURE LATCH OFFSET VOLTAGE

CROSS-REFERENCE TO RELATED APPLICATIONS

Cross reference is made to U.S. Ser. No. 09/676,909, entitled "SERIAL DATA COMMUNICATION RECEIVER HAVING ADAPTIVE TERMINATION RESISTORS", and to U.S. Ser. No. 09/677,269, entitled "SERIAL DATA COMMUNICATION RECEIVER HAVING ADAPTIVE EQUALIZATION," filed on even date herewith.

BACKGROUND OF THE INVENTION

The present invention relates to serial data communication receivers for data capture and clock recovery and, more particularly, to a receiver and method for minimizing capture latch offset voltage.

Serial communication receivers are used in integrated circuits, such as application specific integrated circuits (ASICs), for clock synchronization and for recovery of serial data streams from transmission channels. Clock signals and data are recovered by detecting transitions in the serial data stream and the valid data between those transitions. The time and voltage ranges over which the data is valid within each cycle in the stream is known as the data "eye". In order to minimize bit errors in the recovered data, the serial data stream is preferably sampled by one or more capture latches near the center of this eye. However, the limited-bandwidth nature of a transmission channel results in distortion and closure of the data eye in both the time and voltage domains.

In addition, input-referred offset voltage induced by the capture latches can further reduce the size of the data eye. Because of random, localized process variations, each capture latch can have a slightly different input-referred offset voltage, and these voltages can differ from one receiver to the next.

A serial data communication receiver is desired that is capable of evaluating the performance of a complete transceiver system and adjusting the offset voltage of each capture latch to essentially open the eye of the incoming data stream as seen by the capture latches.

SUMMARY OF THE INVENTION

One aspect of the present invention is directed to a method of adaptively adjusting offset voltages in a serial data communications receiver. The method includes receiving an incoming serial data stream and de-serializing the serial data stream with first and second sets of data capture latches having first and second recovered data outputs, respectively. Each data capture latch comprises a respective independently adjustable input-referred offset voltage. One of the first and second sets is designated as a master set and the other as a slave set. For each of the data capture latches in the slave set, the respective offset voltage is varied over a range of offset voltage values while de-serializing the incoming serial data stream. The first and second recovered data outputs are compared while varying the offset voltage to produce an error output. Each of the respective offset voltages in the slave set is set to one of the offset voltage values based on the error output.

Another aspect of the present invention relates to a serial data communication receiver, which includes a serial data input and first and second sets of data capture latches. The first and second sets of data capture latches are coupled to the serial data input and have first and second recovered data outputs, respectively. One of the sets is designated as a master set and the other a slave set. Each data capture latch has a respective independently adjustable offset voltage. An offset adjustment control circuit varies the respective offset voltage over a range of offset voltage values for each of the data capture latches in the slave set while comparing the first and second recovered data outputs to produce an error output. The control circuit then sets each of the respective offset voltages in the slave set to one of the offset voltage values based on the error output.

Yet another aspect of the present invention relates to a serial data communication receiver, which includes a serial data input and first and second sets of data capture latches coupled to the serial data input. The first and second sets of data capture latches have first and second sets of recovered data outputs. Each data capture latch has a respective adjustable offset voltage. A comparator is coupled to the first and second recovered data outputs and has an error output. A state machine is coupled to the first and second sets of data capture latches and the comparator. The state machine is configured to execute a process in which one of the first and second sets is designated as a master set and the other as a slave set. For each of the data capture latches in the slave set, the state machine varies the respective offset voltage over a range of offset voltage values while monitoring the error output. The state machine sets each of the respective offset voltages in the slave set to one of the offset voltage values based on the monitored error output.

BRIEF DESCRIPTION OF THE DRAWINGS

FIG. 1 is a block diagram of a serial data communication receiver having adaptively minimized capture latch offset voltage according to one embodiment of the present invention.

FIG. 2 is a block diagram illustrating the capture latches in greater detail within a phase-locked loop in the receiver shown in FIG. 1 according to one embodiment of the present invention.

FIG. 3 is a schematic diagram of an individual capture latch with an adjustable offset voltage, which can be used in the receiver shown in FIG. 1.

FIG. 4 is a flowchart illustrating an example of an optimization sequence for adaptively minimizing the capture latch offset voltages according to one embodiment of the present invention.

DETAILED DESCRIPTION OF ILLUSTRATIVE EMBODIMENTS

FIG. 1 is a block diagram of a serial data communication receiver 200 according to one embodiment of the present invention. Receiver 200 is adapted to recover clock signals and data from an incoming serial data stream. In addition, receiver 200 is capable of minimizing the input offset voltage of individual capture latches so that the data stream has the largest possible effective data eye size in the time and voltage domains.

The particular type of receiver shown in FIG. 1 is provided as an example only. Virtually any type of clock recovery and de-serializer circuit can be used with the present invention. For example, one suitable circuit on which the clock recovery and de-serializer functions of the embodiment shown in FIG. 1 are based is disclosed in Fiedler et al. U.S. Pat. No. 5,633,899, which is entitled "PHASE LOCKED LOOP FOR HIGH SPEED DATA CAPTURE OF A SERIAL DATA STREAM" and issued on May 27, 1997. Other examples of suitable circuits include the circuits that implement transceiver standards, such as the Fiber Channel and Gigabit Ethernet standards. Examples of these circuits are manufactured by companies such as Applied Microcircuits Corporation, Vitesse Semiconductor Corp., Motorola, Inc., Texas Instruments, Inc., International Business Machines Corporation, and LSI Logic Corporation. Other clock recovery and de-serializer circuits can also be used.

Referring to FIG. 1, receiver 200 includes a differential serial data input 202. Two termination resistors 204 are coupled between input 202 and voltage bias terminal VDD. Equalizer 207 is coupled in series between input 202 and capture latch array circuits 210A and 210B, respectively. Equalizer 207 boosts the voltage sensitivity of receiver 200 at those frequencies at which attenuation of the incoming data signal is significant due to the frequency response of the transmit media. The net effect is an extension in the flat region of the frequency response of the combination of the transmitter, the transmit media and the receiver. In one embodiment, equalizer 207 can include two passive single-ended equalizers, one for each end of the differential input. In an alternative embodiment, equalizer 207 includes an active differential equalizer. Other types of equalizers can also be used. The equalized serial data output of equalizer 207 is coupled to the inputs of capture latch arrays 210A and 210B. In yet another alternative embodiment, two equalizer circuits 207 are used in parallel with one another, with each equalizer circuit 207 being coupled between serial data input 202 and a respective one of the capture latch arrays 210A and 210B.

Capture latch arrays 210A and 210B are coupled in series between equalizer 207 and inputs IN1 and IN0, respectively, of master/slave multiplexer 212. Equalizer 207 and capture latch array 210A form a first receiver channel "A", and equalizer 207 and capture latch array 210B form a second receiver channel "B". As described in more detail below with reference to FIG. 2, each capture latch array 210A and 210B includes a plurality of data capture latches and a plurality of boundary capture latches for sampling the incoming serial data stream to recover data and clock signals from the stream. The capture latches in arrays 210A and 210B are clocked by respective clock signals 211A and 211B provided through variable delay circuits 214A and 214B. In one embodiment, each capture latch array 210A and 210B includes ten data capture latches, ten boundary capture latches, and twenty respective capture latch clock signals. However, any number of capture latches can be used in alternative embodiments. Each of the data capture latches has an input-referred offset voltage that is individually adjustable by a respective offset control signal. These offset control signals are collectively labeled "OFFA" and "OFFB" in FIG. 1.

The outputs of the data and boundary capture latches are supplied to the respective inputs of multiplexer 212. Multiplexer 212 has a select input labeled MASTER/SLAVE, which is provided by optimization control circuit 208. The output of multiplexer 212 is coupled to the input of data phase detector 216. Based on the state of the MASTER/SLAVE select input, multiplexer 212 determines which of the channels "A" or "B" will be the master channel, and which will be the slave channel. A channel is designated as the master channel when its capture latch outputs control the phase of the sample clock inputs 211A and 211B through data phase detector 216, charge pump 220, loop filter 224 and voltage-controlled oscillator 228. A channel is designated as the slave channel when its capture latch outputs are disconnected from these control-loop elements. The designation and function of a channel as either master or slave is controllable by optimization control circuit 208 through the MASTER/SLAVE select signal. As described in more detail below, the slave channel is used for making various performance measurements in receiver 200 to determine the individual offset voltage adjustment settings for the data capture latches that result in the maximum effective data eye size seen by the capture latches.

The output of multiplexer 212, which includes the data and boundary capture latch outputs of the selected, "master" channel, are provided to the inputs of data phase detector 216. Based on these outputs, data phase detector 216 generates phase correction signals on output 218, which are representative of a difference between a transition of the incoming data stream and a phase of the sample clock signals 211A or 211B provided through variable delay circuits 214A and 214B. These phase correction signals cause charge pump 220 to pump charge onto or off of loop filter 224. The output of loop filter 224 is coupled to control input 226 of VCO 228 for changing the phase and frequency of VCO 228 as a function of the voltage on loop filter 224.

In one embodiment, VCO 228 has multiple stages or phases for generating a plurality of sample clock signals on outputs 230A and 230B. Each sample clock signal is delayed from the previous clock signal by an adjustable delay, which is based on the voltage applied to voltage control input 226 of VCO 228. These sample clock signals are provided to capture latch arrays 210A and 210B through variable delay circuits 214A and 214B. By using multiple capture latch elements and multiple phases of the sample clock, the incoming high-speed serial data stream can be sampled with VCO 228 oscillating at only a fraction of the data bit rate.

Variable delay elements 214A and 214B have control inputs DELAYA and DELAYB, which are provided by optimization control circuit 208. Variable delay circuits 214A and 214B allow the sample times of the capture latches in one of the capture latch arrays 210A and 210B to be varied relative to the sample times of the other of the capture latch arrays 210A and 210B so that the size of the data eye at the inputs of arrays 210A and 210B can be probed in the time domain. During normal operation, the delay through variable delay elements 214A and 214B are set to a fixed (and usually minimum) delay.

Capture latch arrays 210A and 210B, data phase detector 216, charge pump 220, loop filter 224 and VCO 228 together operate as a phase-locked loop 280, which adjusts the phase and frequency of VCO 228 to match the phase and frequency of the transitions in the incoming data stream. When VCO 228 has locked onto the incoming data stream, one of the sample clock signals generated by VCO 228 can be used as a recovered clock signal that is provided to recovered clock output 264. This clock signal can also be used to align the data recovered by capture latch arrays 210A and 210B to a single clock signal.

Data alignment is performed by data alignment circuits 240A and 240B. The outputs of the data capture latches in capture latch arrays 210A and 210B are coupled to data inputs 244A and 244B, respectively, of data alignment circuits 240A and 240B. The recovered clock signals are provided to clock inputs 246A and 246B of data alignment circuits 240A and 240B for synchronizing the valid data from each capture latch to a single clock edge. Data alignment circuits 240A and 240B have parallel recovered data outputs 248A and 248B, which are coupled to inputs IN1 and IN0, respectively, of multiplexer 250 and to comparison inputs 252 and 254, respectively, of error detection comparator 256.

Multiplexer 250 includes a select input labeled MASTER/SLAVE, which is provided by optimization control circuit 208. Similar to multiplexer 212, multiplexer 250 is controlled to select data from the channel that is currently designated as the "master" channel. This data is provided to the data input of flip-flop circuit 260, which is clocked by the recovered clock signal from VCO 228. The output of flip-flop circuit 260 is coupled to recovered data output 262.

Error detection comparator 256 detects differences between the data recovered by the slave channel and the data recovered by the master channel. Clock input 258 is used to synchronize the comparison to the time at which the comparison inputs 252 and 254 are valid. Comparison output 270 represents the resulting difference or error, and is coupled to error input 272 of optimization control circuit 208.

Optimization control circuit 208 executes an optimization sequence to find the offset voltage adjustment for each individual data capture latch that results in the largest possible effective opening in the data eye seen by that capture latch in the time and voltage domains. As discussed in more detail with reference to FIG. 4, this optimization sequence measures the data eye by sweeping the delay in the clock signals applied to the slave capture latches and, for each delay setting, sweeping the offset voltage applied by the capture latch. Differences seen between the recovered data from the slave channel and the master channel can be used to identify the size of the data eye. The optimization sequence can be implemented by a programmed computer or can be reduced to a state machine, for example. Individual components of optimization control circuit 208 or functions performed by circuit 208 can be implemented in hardware, software or a combination of both. The timing of the optimization sequence is controlled by clock input 274.

FIG. 2 is a block diagram illustrating one of the capture latch arrays 210A and 210B in greater detail within phase-locked loop 280 of receiver 200 shown in FIG. 1, according to one embodiment of the present invention. For simplicity, only one capture latch array is shown, with multiplexer 212 also being eliminated from the drawing. The same reference numerals are used in FIG. 2 as were used in FIG. 1 for the same or similar components.

Phase-locked loop 280 includes a multiple-bit capture latch array 210 (either 210A or 210B in FIG. 1) for sampling the equalized serial data stream applied to differential inputs 281 and 282. Capture latch array 210 includes individual latch elements L1–L20 (L4–L19 not shown), which sample the data stream at different phases in response to sample clock signals CK1–CK20 (CK4–CK19 not shown) received from VCO 226 through variable delay circuit 214 (either 214A or 214B in FIG. 1). Each capture latch element samples either the data bit or the boundary between data bits (i.e., a transition). Capture latch elements L1–L20 are labeled "D" and "B" to indicate data capture latch elements and boundary capture latch elements, respectively.

A typical data stream is divided into groups of N bits of data. Capture latch array 210 includes 2*N capture latch elements for each of the N bits of data in the group. For example, if the data in the data stream is divided into groups of ten bits, twenty capture latch elements L1–L20 are used to sample the ten data bits during a single VCO clock cycle. When in lock, every other capture latch will sample near the center of the data eye while the remaining capture latches will sample near the data transitions.

The phase and frequency at which each capture latch element samples the data stream is controlled by VCO 228, which has multiple stages for generating sample clock signals CK1–CK20. Each sample clock signal is delayed from the previous clock signal by an adjustable delay based on the voltage applied to voltage control input 226. These sample clock signals are passed through variable delay circuit 214 as discussed above with reference to FIG. 1.

Variable delay circuit 214 (either 214A or 214B in FIG. 1) delays each sample clock signal CK1–CK20 by a programmable delay, which is controlled by delay control input DELAY (either DELAYA or DELAYB in FIG. 1). When the particular capture latch array 210 is operating in the master mode, optimization control circuit 208 (shown in FIG. 1) sets the delay through variable delay circuit 214 to a minimal delay setting through delay control input DELAY. When the particular capture latch array 210 is operating in the slave mode, optimization control circuit 208 sweeps the delay through variable delay circuit 214 over the range of different delay values according to the optimization sequence to change the phases of clock circuits CK1–CK20 in the slave channel relative to the phases of the respective clock signals in the master channel.

Each sample clock generated by VCO 228 has a plurality of cycles, with each cycle having a positive phase and a negative phase. The frequency at which VCO 228 must oscillate can be reduced by a factor of two by organizing the capture latch elements into two groups which sample the data stream on opposite phases of the sample clocks. For example, if clocks CK11–CK20 correspond to the negative phase or edge of sample clocks CK1–CK10, respectively, then only ten sample clock signals are required to trigger capture latches L1–L20. Capture latch elements L1–L10 sample the data stream on the positive phase of sample clocks CK1–CK10 while capture latch elements L11–L20 sample the data stream on the negative phase of sample clocks CK1–CK10 (i.e. CK11–CK20).

Data phase detector 216 looks for the transitions in the input data stream and adjusts the phase and frequency of VCO 228 to match the phase and frequency of the transitions. For example, consider a case where a leading data capture latch captures a "1" and the subsequent (in time) data capture latch captures a "0". Data phase detector 216 uses the result at the output of the intermediate boundary capture latch (being clocked by a boundary capture latch clock of a phase intermediate of the leading data capture latch clock and the subsequent data capture latch clock) to determine if the boundary capture latch clock transition is leading or lagging the data transition. If the boundary capture latch captures a "1", the boundary capture latch clock transition is assumed to be leading the data transition since the subsequent data bit is a "0" and not a "1". If the boundary capture latch captures a "0", then the boundary capture latch clock transition is assumed to be trailing the data transition. If any leading data capture latch, adjacent boundary capture latch and subsequent data capture latch all capture a "0" or a "1", no determination of relative phase can be made by the circuit, and no adjustment of phase or frequency can be made.

Data phase detector 216 determines phase with an exclusive-OR tree formed by a plurality of exclusive-OR gates XOR1–XOR20 (XOR4–XOR19 not shown). The inputs of XOR1 are coupled to the non-inverted outputs of capture latches L1 and L2. The inputs of XOR2 are coupled to the non-inverted outputs of capture latches L2 and L3. The inputs of XOR3–XOR20 are coupled in a similar fashion.

Exclusive-OR gates XOR1–XOR20 are labeled DOWN and UP to indicate which exclusive-OR gates delay and slow down VCO 228 by increasing the delay between each sample clock signal and which exclusive-OR gates advance and speed up VCO 228 by decreasing the delay between each sample clock signal. The exclusive-OR gates that operate on output data from a data capture latch and the preceding (in time) boundary capture latch are referred to as DOWN exclusive-OR gates. The exclusive-OR gates that operate on a data capture latch and the trailing (in time) boundary capture latch are referred to as UP exclusive-OR gates.

A data transition between the sample time of boundary capture latch L1 and the sample time of data capture latch L2 generates a logic HIGH level (or "true" state) on the output of XOR1 indicating that VCO 228 should be delayed slightly since boundary capture latch L1 captured the data prior to the actual data transition. A transition between the sample time of data capture latch L2 and the sample time of boundary capture latch L3 generates a logic HIGH level on XOR2 indicating that VCO 228 should be advanced slightly, since boundary capture latch L1 latched after the actual data transition. Logic LOW levels (or "false" states) on the outputs of exclusive-OR gates XOR1–XOR20 induce no change in the phase or frequency of VCO 228.

The outputs of exclusive-OR gates XOR1–XOR20 form phase correction signals which are fed to voting circuit 290 through AND gates A1–A20. Voting circuit 290 compares the relative number of "down" exclusive-OR gates having a logic HIGH output with the number of "up" exclusive-OR gates having a logic HIGH output. If there are more "downs" than "ups", voting circuit 290 generates a logic HIGH level on phase control output 218A causing charge pump 220 to reduce the voltage across loop filter 224 slightly which causes VCO 228 to delay clock signals CK1–CK20. If there are more "ups" than "downs", voting circuit 290 generates a logic HIGH level on phase control output 218B causing charge pump 220 to increase the voltage across loop filter 224 slightly which causes VCO 228 to advance clock signals CK1–CK20.

If all "up" and "down" exclusive-OR gates are LOW or the number of "ups" and "downs" are equal, charge pump 220 makes no change to the voltage across filter 224. In one embodiment, voting circuit 120 is implemented with combinational logic. In an alternative embodiment, voting circuit 404 and charge pump 220 are replaced with ten charge pumps operating in parallel on filter 224.

Data valid circuit 292 prevents the phase correction signals from being applied to charge pump 220 until the data in capture latches L1–L20 are valid. The data valid circuit includes AND gates A1–A20 (A4–A19 not shown) and exclusive-OR gates XOR21–XOR40 (XOR24–XOR39 not shown). Exclusive-OR gates XOR21–XOR40 are coupled across the latch outputs of respective capture latches L1–L20, which are pre-charged to a common level in one embodiment. Data valid outputs DVD1–DVD20 of exclusive-OR gates XOR21–XOR40 indicate when the data in capture latches L1–L20 are valid (i.e. not the same). AND gates A1–A20 are coupled between exclusive-OR gates XOR1–XOR20 and voting circuit 404 to gate the phase correction signals with data valid outputs DVD1–DVD20. The output of each exclusive-OR gate XOR1–XOR20 is gated with the data valid outputs that correspond to the inputs of that exclusive-OR gate.

The data capture latch elements (i.e. the evenly numbered elements L2–L20 that are labeled "D" in FIG. 2), further include offset control inputs OFF1–OFF10, respectively, for individually adjusting the input-referred offset voltage for the respective capture latches. The offset voltage control inputs OFF1–OFF20 are collectively referred to as OFFA and OFFB in FIG. 1. With these individual offset control inputs, optimization control circuit 208 can find the optimal offset adjustment for each capture latch that results in the largest possible effective data eye size seen at the inputs of that capture latch.

Once again, the particular phase-locked loop shown in FIG. 2 is provided as an example only. The present invention can be used with virtually any type of serial communications receiver. The receiver would simply be modified to include variable delay elements, two separate sets of capture latch arrays, with each data capture latch having an adjustable offset voltage, and corresponding control circuitry.

FIG. 3 is a schematic diagram illustrating the offset adjustment of a single data capture latch in greater detail. The capture latch includes inputs A and AN, outputs Q and QN, clock input CLK and offset control inputs OFFSETP and OFFSETM. Inputs A and AN are coupled to the gates of differential transistors M3 and M4, respectively. The sources of transistors M3 and M4 are coupled to the drain of latch control transistor M5. The gate of transistor M5 is coupled to clock input CLK, and the source of transistor M5 is coupled to ground terminal GND.

Transistors M6–M9 form a pair of cross-coupled inverters 501 and 502 between capture latch outputs Q and QN. Transistors M6 and M8 form inverter 501, which has an input coupled to capture latch output Q and an output coupled to capture latch output QN. Transistors M7 and M9 form inverter 502, which has an input coupled to capture latch output QN and an output coupled to capture latch output Q. Pull-up transistor M10 is coupled between capture latch output QN and voltage supply terminal VDD, and pull-up transistor Mil is coupled between capture latch output Q and voltage supply terminal VDD. Offset control transistor M12 is coupled between capture latch output QN and voltage supply terminal VDD, and offset control transistor M13 is coupled between capture latch output Q and voltage supply terminal VDD. The gates of offset control transistors M12 and M13 are coupled to offset control inputs OFFSETM and OFFSETP, respectively.

During operation, when clock input CLK is inactive, pull-up transistors M10 and M11 pull capture latch outputs Q and QN toward the voltage on voltage supply terminal VDD. This resets the latch by balancing outputs Q and QN. When clock input CLK goes active, pull-up transistors M10 and M11 turn off, releasing outputs Q and QN, and latch control transistor M5 turns on, providing current to differential transistor pair M3 and M4. Depending on whether the voltage at input A or AN is greater than the other, differential transistor pair M3 and M4 will steer current through cross-coupled inverters 301 and 302 so as to pull one of the capture latch outputs Q and QN low and the other of the capture latch outputs Q and QN high.

An offset voltage between inputs A and AN can be induced by applying different voltages to offset control inputs OFFSETP and OFFSETM. If OFFSETP is greater than OFFSETM, an offset voltage induced between inputs A and AN will be positive. If OFFSETP is less than OFFSETM, the offset voltage induced between inputs A and AN will be negative.

The offset control inputs OFFSETP and OFFSETM of the data capture latches are controlled by optimization control circuit 208 (shown in FIG. 1). Optimization control circuit 208 can induce or adjust an input offset voltage at the inputs of each individual data capture latch in the slave channel by controlling the voltages applied to offset control inputs OFFSETP and OFFSETM. This method of offset control is used to maximize the size of the data eye in the voltage domain.

FIG. 4 is a flowchart illustrating an example of an optimization sequence for adaptively setting the offset control input for each data capture latch according to one embodiment of the present invention. At step 401, optimization control circuit 208 designates one channel to operate as the master channel and the other channel to operate as the slave channel. Optimization control circuit 208 also initializes the variable channel delays to minimum delay settings.

At step 402, optimization control circuit 208 waits for the master channel to lock onto the incoming serial data stream. Once the master channel has locked onto the data stream, optimization control circuit 208 adjusts the input offset voltage of each slave channel data capture latch and the variable delay in variable delay 214 (either 214A or 214B, depending on which channel is the slave channel) to probe the size of the data eye in the voltage and time domains for that data capture latch, at step 403.

For each slave channel data capture latch "I", for I=1 to N, where N is the number of data capture latches in the slave channel, optimization control circuit 208 performs a test to determine the optimum offset adjustment for the Ith data capture latch. In the test, optimization control circuit 208 first initializes all slave channel data capture latch offset adjustments to zero through control signals OFF1–OFFN. Optimization control circuit 208 then sweeps the slave channel variable delay over a range of slave channel delay values. For each slave channel delay setting, optimization control circuit 208 sweeps the input offset voltage adjustment setting for the Ith slave channel data capture latch over a range of offset adjustment values.

As the magnitude of the variable delay and/or the magnitude of the voltage offset applied to the Ith capture latch is varied from an optimal value, the recovered data from the slave data capture latches begins to differ from the recovered data from the master data capture latches. The rate at which these differences occur on error output 270 (shown in FIG. 1) at each delay and voltage offset setting is stored by optimization control circuit 208 in a register or other computer readable memory. The stored error rates, in total, reflect the size of the data eye in the voltage domain for each variable delay setting. Based on the errors recorded in the above test, optimization control circuit 208 determines and records the optimum offset adjustment for the Ith slave channel data capture latch that results in the largest effective data eye size for that capture latch.

Once all slave channel data capture latches have been tested in step 403, optimization control circuit 208 sets the offset adjustment for each slave channel data capture latch (I=1 to N) to that determined in step 403, at step 404. At step 405, optimization control circuit 208 returns the slave channel variable delay to the minimum setting. At step 406, optimization control circuit 208 toggles the master/slave select signal, waits for the newly designated master channel to lock onto the data and then repeats steps 402–405 for the newly designated slave channel. Either channel can be used as the master channel or the slave channel, and the operating modes of the two channels can "ping-pong" back and forth with each channel alternately operating as a master channel and as a slave channel.

In an alternative embodiment, variable delay elements 214A and 214B in FIG. 1 are removed. In this embodiment, the optimization sequence shown in FIG. 4 is modified in step 403 to remove reference to the slave channel delay setting, and the voltage offset is selected for each slave channel data capture latch by sweeping the offset adjustment for that data capture latch while storing the respective error rates. Based on the stored error rates, optimization control circuit 208 selects an offset adjustment that results in the smallest number of errors.

The optimization sequence shown in FIG. 4 allows the offset voltages of individual data capture latches to be optimized for any application. Since the offset voltage due to the transmit media can vary with each application, and since the offset voltages of individual data capture latches can vary from one another in a single application, the serial data communication receiver of the present invention evaluates these performance parameters. The offset voltages of the individual data capture latches in the receiver can then be adjusted to compensate for variations in these performance parameters and essentially open the "eye" of the incoming data to reduce bit errors. The offset voltages are therefore improved for any application.

Although the present invention has been described with reference to preferred embodiments, workers skilled in the art will recognize that changes may be made in form and detail without departing from the spirit and scope of the invention. For example, a wide variety of clock recovery and de-serializer circuits can be used within the overall receiver apparatus discussed above. Also, a variety of test procedures and optimization sequences can be used to adaptively adjust offset voltages of individual capture latches or groups of capture latches according to the present invention. The procedures and sequences can be implemented in hardware or software, a finite state machine or a programmable computer, for example. Also, the receiver can be implemented with two separate phase-locked loops, one for each capture latch circuit in alternative embodiments. In addition, the term "coupled" used in the specification and the claims can include various types of connections or couplings and can include a direct connection or a connection through one or more intermediate components.

What is claimed is:

1. A method of adaptively adjusting offset voltages in a serial data communications receiver, the method comprising:

(a) receiving an incoming differential serial data stream;

(b) de-serializing the serial data stream with first and second sets of differential data capture latches having first and second recovered data outputs, respectively, wherein each set comprises a plurality of data capture latches and each data capture latch comprises a respective independently adjustable differential, input-referred offset voltage and samples the serial data stream at a respective sample time that is different from the sample times of the other data capture latches in that set;

(c) designating one of the first and second sets as a master set and the other as a slave set;

(d) for each of the data capture latches in the slave set, varying the respective offset voltage over a range of offset voltage values during step (b);

(e) comparing the first and second recovered data outputs during step (d) to produce an error output; and (f) setting each of the respective offset voltages in the slave set to one of the offset voltage values based on the error output.

2. The method of claim 1 wherein step (e) comprises:

(e)(1) comparing the first and second recovered data outputs to one another to obtain a bit error rate for each offset voltage value in step (d); and (e)(2) storing the bit error rate for each of the offset voltage values in a computer readable memory.

3. The method of claim 1 wherein:

step (b) comprises:

(b)(1) sampling the serial data stream with the master set of data capture latches to produce one of the first and second recovered data outputs; and (b)(2) sampling the serial data stream with the slave set of data capture latches to produce the other of the first and second recovered data outputs; and step (d) comprises:

(d)(1) delaying the sample times of the slave set by a variable delay relative to the sample times of the master set;

(d)(2) varying the variable delay over a range of delay values; and (d)(3) varying the respective offset voltage over the range of offset voltage values for each of the delay values in step (d)(2).

4. The method of claim 3 wherein step (e) comprises, for each of the data capture latches in the slave set:

(e)(1) for each delay value in step (d)(2), comparing the first and second recovered data outputs to one another to obtain a bit error rate for each offset voltage value in step (d)(3); and (e)(2) storing the bit error rates obtained in step (e)(1) in a computer readable memory.

5. The method of claim 4 wherein step (f) comprises, for each of the data capture latches in the slave set:

(f)(1) determining an optimum one of the offset voltage values that results in a maximum data eye size of the received serial data stream at that data capture latch based on the error rates stored in step (e)(2); and (f)(2) setting the respective offset voltage of each of the plurality of data capture latches in the slave set to the optimum offset voltage value for that data capture latch determined in step (f)(1).

6. The method of claim 1 and further comprising:

(g) designating the one of the first and second sets as the slave set and the other as the master set; and (h) performing steps (d)–(f) for the slave set designated in step (g).

7. A serial data communication receiver comprising:

a differential serial data input;

first and second sets of plural differential data capture latches coupled to the serial data input, within a phase-locked loop, and having first and second recovered data outputs, respectively, wherein one of the sets is a master set and the other set is a slave set and wherein each data capture latch comprises a respective independently adjustable differential, input-referred offset voltage and samples the serial data stream at a respective sample time that is different from the sample times of the other data capture latches in the respective set; and offset adjustment control means for varying the respective offset voltage over a range of offset voltage values for each of the data capture latches in the slave set while comparing the first and second recovered data outputs to produce an error output and for setting each of the respective offset voltages in the slave set to one of the offset voltage values based on the error output.

8. The serial data communication receiver of claim 7 wherein the offset adjustment control means comprises:

a comparator having first and second comparison inputs coupled to the first and second recovered data outputs, respectively, and having a comparison output; and a control circuit, which is adapted to vary the respective offset voltage over the range of offset voltage values while measuring a bit error rate on the comparison output for each of the offset voltage values.

9. The serial data communication receiver of claim 7 wherein:

the data capture latches in the master and slave sets each comprise a sample clock input, which controls the sample time of that data capture latch; and the offset adjustment control means comprises:

a variable delay, which is coupled in series with the sample clock inputs of the slave set of data capture latches and is variable over a range of delay values;

a comparator having first and second comparison inputs coupled to the first and second recovered data outputs, respectively, and having a comparison output; and a control circuit, which is adapted to vary the variable delay over the range of delay values and to vary the respective offset voltage over the range of offset voltage values for each of the delay values.

10. The serial data communication receiver of claim 9 wherein the offset adjustment control means further comprises means for monitoring the comparison output for each data capture latch in the slave set to obtain a bit error rate at each of the offset voltage values as the variable delay is varied over the range of delay values.

11. The serial data communication receiver of claim 10 wherein the offset adjustment control means further comprises means for setting the respective offset voltage of each of the plurality of data capture latches in the slave set to a respective optimum one of the offset voltage values for that data capture latch, wherein the respective optimum offset voltage results in a maximum data eye size of the serial data input for that capture latch.

12. The serial data communication receiver of claim 7 wherein the offset adjustment control means comprises means for alternately designating the one of the first and second sets as the slave set and the other as the master set.

13. A serial data communication receiver comprising:

a differential serial data input;

first and second sets of plural differential data capture latches coupled to the serial data input and having first and second sets of recovered data outputs, respectively, wherein each data capture latch has a respective adjustable differential, input-referred offset voltage and samples the serial data stream at a respective sample time that is different from the sample times of the other data capture latches in the respective set;

a comparator coupled to the first and second recovered data outputs and having an error output; and a state machine configured to execute a process comprising:

(a) designating one of the first and second sets as a master set and the other as a slave set;

(b) for each of the data capture latches in the slave set, varying the respective offset voltage over a range of offset voltage values;

(c) monitoring the error output during step (b); and (d) setting each of the respective offset voltages in the slave set to one of the offset voltage values based on the error output monitored in step (c).

14. The serial data communication receiver of claim 13 wherein:

the sample times of the slave set of data capture latches are variable relative to the sample times of the master set of data capture latches; and the state machine is further configured to:

(e) vary the variable sample times of the slave set of data capture latches relative to the master set of data capture latches over a range of delay values; and (f) varying the respective offset voltage over the range of offset voltage values for each of the delay values in step (e).

* * * * *